US009679661B1

(12) United States Patent
Guo et al.

(10) Patent No.: US 9,679,661 B1
(45) Date of Patent: Jun. 13, 2017

(54) NON-VOLATILE STORAGE SYSTEM WITH SELF-TEST FOR READ PERFORMANCE ENHANCEMENT FEATURE SETUP

(71) Applicant: SANDISK TECHNOLOGIES LLC, Plano, TX (US)

(72) Inventors: Zelei Guo, San Jose, CA (US); Joanna Lai, San Jose, CA (US); Deepak Raghu, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/195,492

(22) Filed: Jun. 28, 2016

(51) Int. Cl.
| | |
|---|---|
| *G11C 16/06* | (2006.01) |
| *G11C 16/26* | (2006.01) |
| *G11C 16/04* | (2006.01) |
| *G11C 16/08* | (2006.01) |
| *G06F 11/07* | (2006.01) |
| *G11C 7/06* | (2006.01) |
| *G11C 16/28* | (2006.01) |

(52) U.S. Cl.
CPC ............ *G11C 16/26* (2013.01); *G06F 11/073* (2013.01); *G06F 11/076* (2013.01); *G11C 7/062* (2013.01); *G11C 16/0483* (2013.01); *G11C 16/08* (2013.01); *G11C 16/28* (2013.01)

(58) Field of Classification Search
CPC ..... G11C 16/28; G11C 16/26; G11C 16/0483; G11C 11/5642; G11C 7/062
See application file for complete search history.

(56) References Cited

U.S. PATENT DOCUMENTS

| | | | |
|---|---|---|---|
| 5,859,858 A | 1/1999 | Leeman | |
| 6,751,766 B2 | 6/2004 | Guterman | |
| 7,117,399 B2 | 10/2006 | Song | |
| 7,360,136 B2 | 4/2008 | Guterman | |
| 7,372,731 B2 | 5/2008 | Ban | |
| 7,805,663 B2 | 9/2010 | Brandman | |
| 7,848,171 B2 | 12/2010 | Miyako | |
| 8,081,508 B2 | 12/2011 | Kim | |
| 8,125,833 B2 | 2/2012 | Sharon | |
| 8,412,987 B2 * | 4/2013 | Billing | G06F 11/1008 714/710 |
| 8,812,934 B2 * | 8/2014 | Guyot | G06F 11/08 714/764 |
| 8,938,659 B2 | 1/2015 | Wu | |
| 8,971,111 B2 | 3/2015 | Ghaly | |
| 9,001,579 B2 | 4/2015 | Song | |
| 9,037,929 B2 * | 5/2015 | Lee | G11C 16/10 714/719 |

(Continued)

OTHER PUBLICATIONS

Patent Application filed Aug. 18, 2016 in U.S. Appl. No. 15/240,370.

(Continued)

*Primary Examiner* — Pho M Luu
(74) *Attorney, Agent, or Firm* — Vierra Magen Marcus LLP

(57) ABSTRACT

Performance improvement features can improve the performance of read processes under the right conditions. In order to selectively use the performance improvement features, the system conducts active read sampling to obtain information about bit error rate and then enables the performance improvement feature(s) for future read processes based on the information about bit error rate.

20 Claims, 12 Drawing Sheets

(56) References Cited

U.S. PATENT DOCUMENTS

| | | |
|---|---|---|
| 9,111,626 B2 | 8/2015 | Kim |
| 9,135,993 B2 | 9/2015 | Ebsen |
| 9,337,865 B2 | 5/2016 | Cohen |
| 9,343,121 B2 | 5/2016 | Jang |
| 9,478,303 B1 | 10/2016 | Parker |
| 2008/0163028 A1 | 7/2008 | Mokhlesi |
| 2009/0019321 A1 | 1/2009 | Radke |
| 2010/0162084 A1 | 6/2010 | Coulson |
| 2010/0296350 A1 | 11/2010 | Kim |
| 2013/0176784 A1 | 7/2013 | Cometti |
| 2014/0101519 A1* | 4/2014 | Lee .................... G06F 11/1068 714/773 |
| 2014/0237165 A1* | 8/2014 | Seo .................... G06F 12/0246 711/103 |

OTHER PUBLICATIONS

Response to Office Action dated Feb. 17, 2017, U.S. Appl. No. 15/240,370.

Office Action dated Dec. 1, 2016, U.S. Appl. No. 15/240,370.

Notice of Allowance dated dated Mar. 17, 2017, U.S. Appl. No. 15/240,370.

* cited by examiner

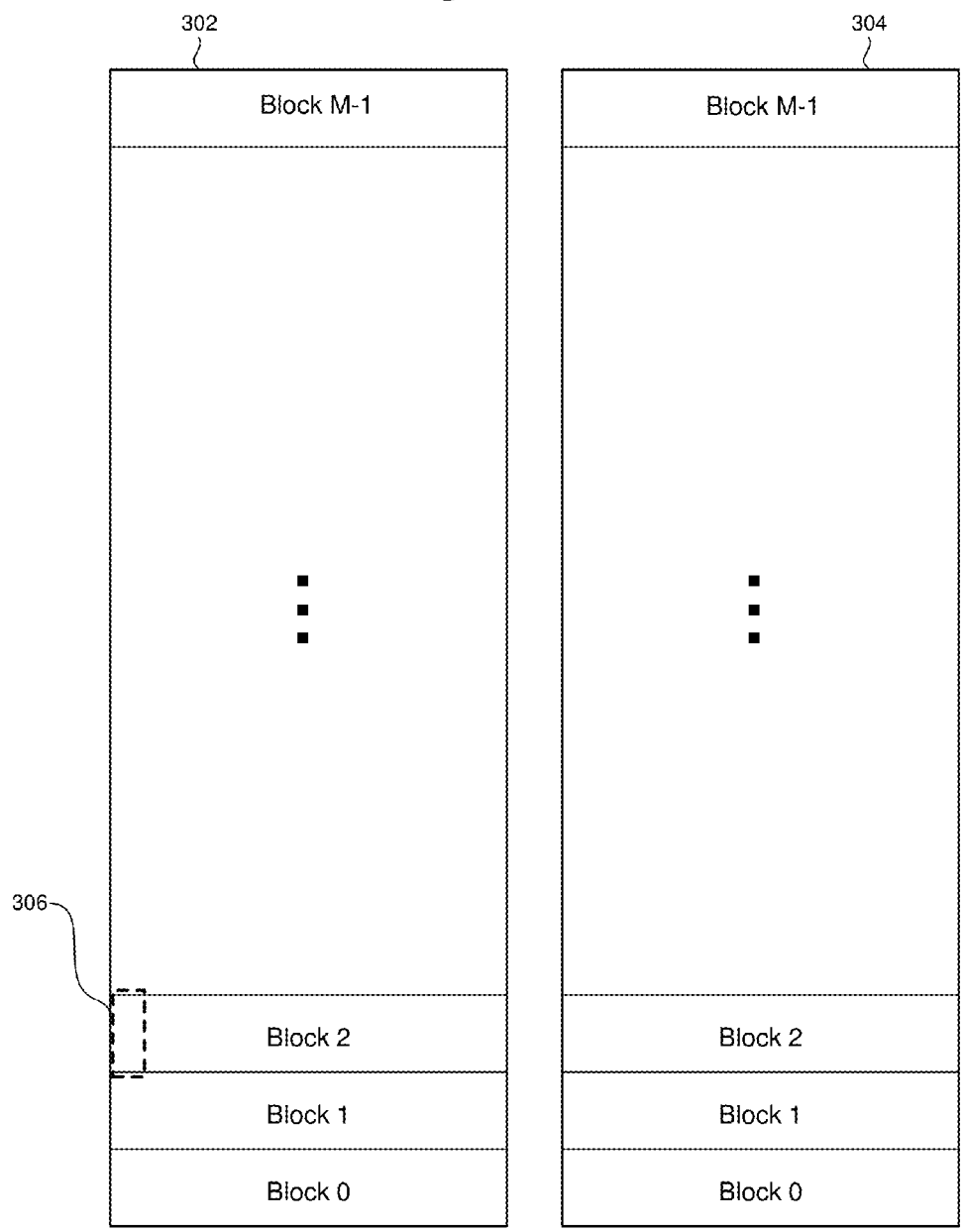

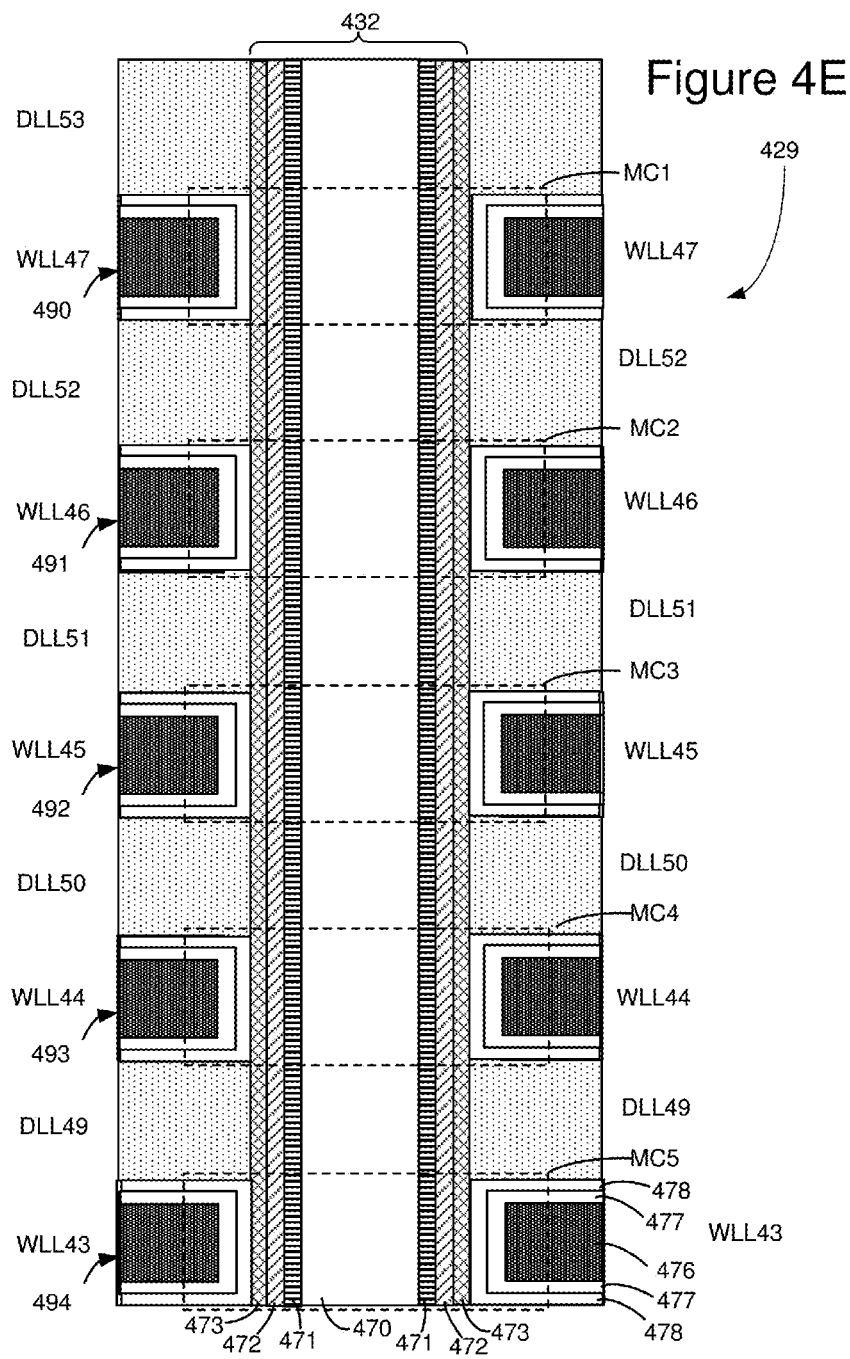

Figure 5
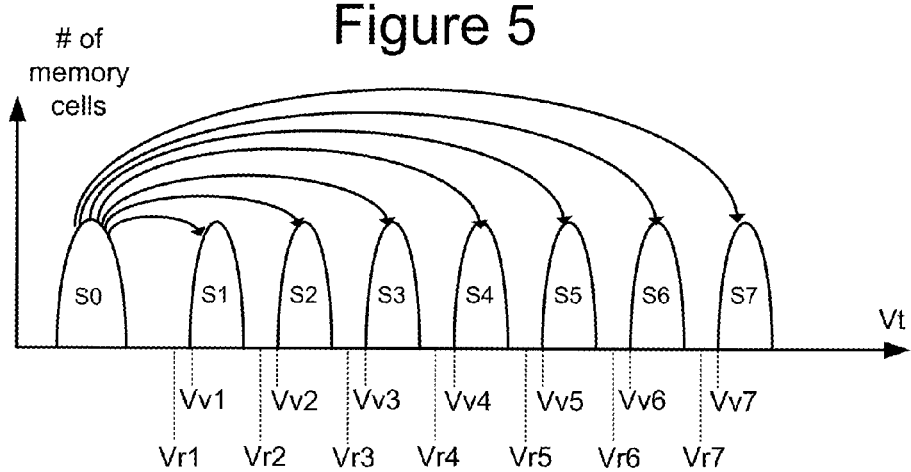
Figure 5A
|            | S0 | S1 | S2 | S3 | S4 | S5 | S6 | S7 |
|------------|----|----|----|----|----|----|----|----|
| Upper Page | 1  | 1  | 1  | 0  | 0  | 0  | 0  | 1  |
| Middle Page| 1  | 1  | 0  | 0  | 1  | 1  | 0  | 0  |
| Lower Page | 1  | 0  | 0  | 0  | 0  | 1  | 1  | 1  |
Figure 6
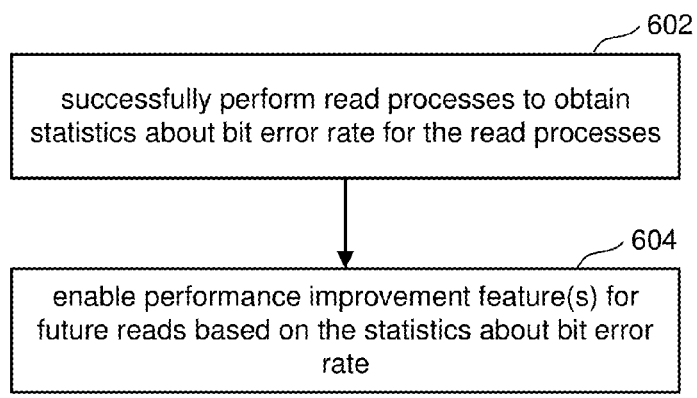

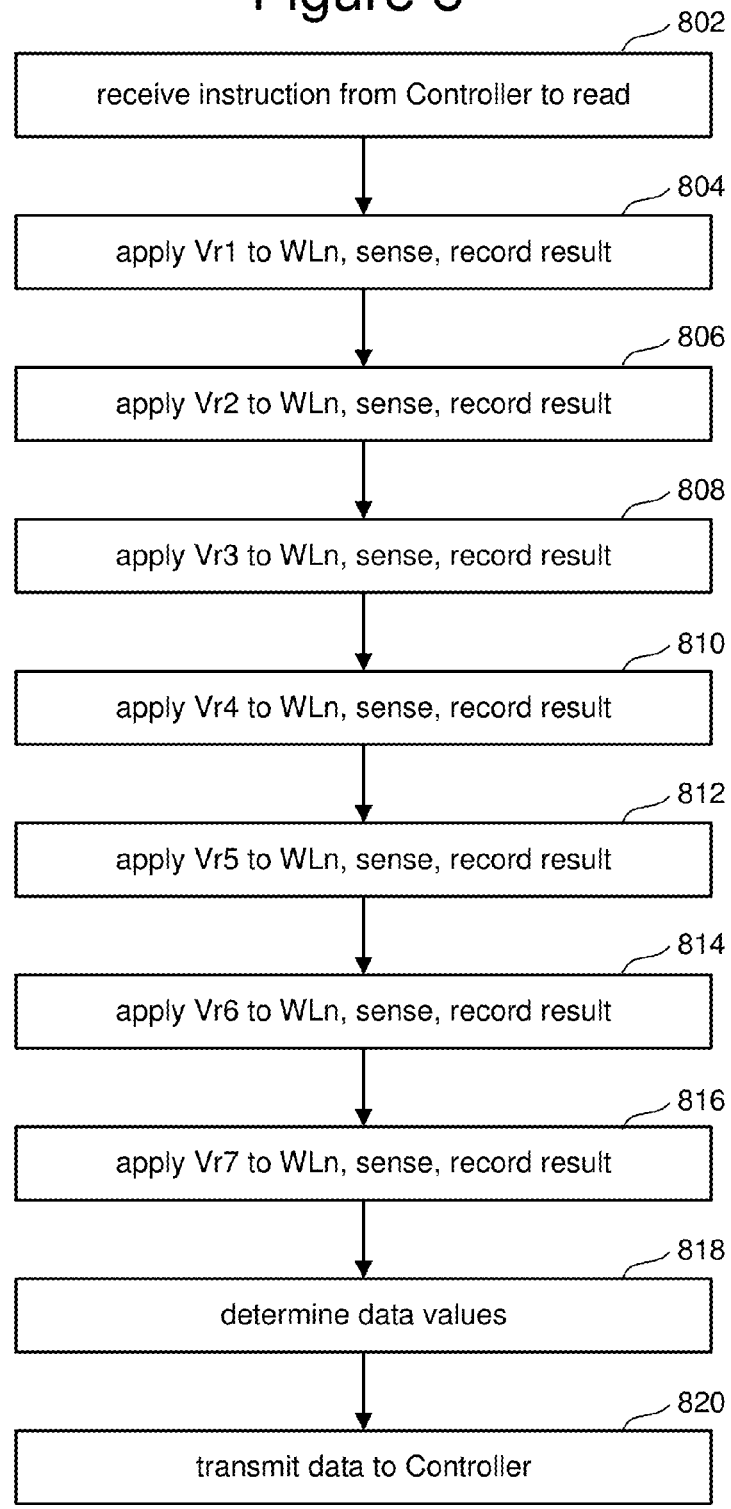

NON-VOLATILE STORAGE SYSTEM WITH SELF-TEST FOR READ PERFORMANCE ENHANCEMENT FEATURE SETUP

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

A charge-trapping material can be used in non-volatile memory devices to store a charge which represents a data state. The charge-trapping material can be arranged vertically in a three-dimensional (3D) stacked memory structure. One example of a 3D memory structure is the Bit Cost Scalable (BiCS) architecture which comprises a stack of alternating conductive and dielectric layers. A memory hole is formed in the stack and a vertical NAND string is then formed by filling the memory hole with materials including a charge-trapping layer to create a vertical column of memory cells. Each memory cell can store one or more bits of data.

When a memory system is deployed in a host device, the memory system can be used to stored data provided by the host device. The data can then be read back and provided to the host in response to read requests from the host. To reduce latency in responding to read requests, it is desired to improve performance of the read processes performed by the memory system.

BRIEF DESCRIPTION OF THE DRAWINGS

Like-numbered elements refer to common components in the different figures.

FIG. 4A is a block diagram of a memory structure having two planes.

FIG. 4E is a cross sectional view of a vertical column of memory cells.

FIG. 5 depicts threshold voltage distributions.

FIG. 5A is a table describing one example of an assignment of data values to data states.

FIG. 6 is a flow chart describing one embodiment of a process for performing read sampling to obtain information about bit error rate and enabling a performance improvement feature for future read processes based on the information about bit error rate.

FIG. 8 is a flow chart describing one embodiment of a process for reading.

DETAILED DESCRIPTION

Performance improvement features can improve the performance of read processes under the right conditions. In order to selectively use the performance improvement features, the system conducts active read sampling to obtain information about bit error rate and then enables the performance improvement feature(s) for future read processes based on the information about bit error rate.

Figure 1:
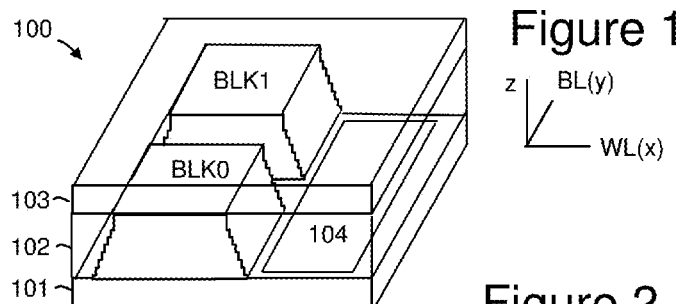
FIG. 1 is a perspective view of a 3D stacked non-volatile memory device.

FIGS. 1-4F describe one example of a memory system that can be used to implement the technology proposed herein. FIG. 1 is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
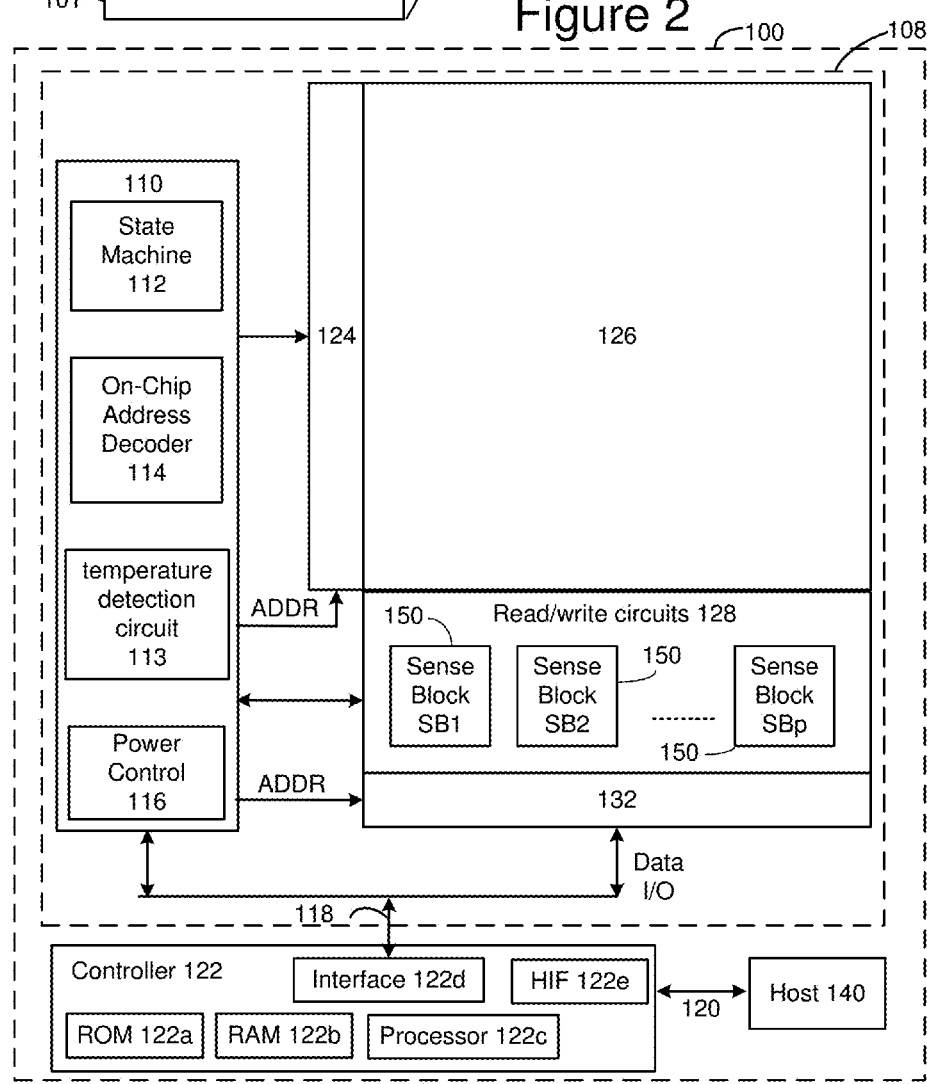
FIG. 2 is a functional block diagram of a memory device such as the 3D stacked non-volatile memory device 100 of FIG. 1.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 includes a three dimensional memory structure 126 of memory cells (such as, for example, a 3D array of memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks 150 including SB1, SB2, . . . , SBp (sensing circuitry) and allow a page of memory cells to be read or programmed in parallel. In some systems, a Controller 122 is included in the same memory device 100 (e.g., a removable storage card) as the one or more memory die 108. However, in other systems, the Controller can be separated from the memory die 108. In some embodiments the Controller will be on a different die than the memory die. In some embodiments, one Controller 122 will communicate with multiple memory die 108. In other embodiments, each memory die 108 has its own Controller. Commands and data are transferred between the host 140 and Controller 122 via a data bus 120, and between Controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Temperature detection circuit 113 is configured to detect temperature, and can be any suitable temperature detection circuit known in the art. In one embodiment, state machine 112 is programmable by the software. In other embodiments, state machine 112 does not use software and is completely implemented in hardware (e.g., electrical circuits). In one embodiment, control circuitry 110 includes registers, ROM fuses and other storage devices for storing default values such as base voltages and other parameters.

The on-chip address decoder 114 provides an address interface between addresses used by host 140 or Controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, temperature detection circuit 113, power control module 116, sense blocks 150, read/write circuits 128, and Controller 122 can be considered one or more control circuits (or a managing circuit) that performs the functions described herein.

The (on-chip or off-chip) Controller 122 (which in one embodiment is an electrical circuit) may comprise a processor 122c, ROM 122a, RAM 122b, Memory Interface 122d and Host Interface 122e, all of which are interconnected. Processor 122C is one example of a control circuit. Other embodiments can use state machines or other custom circuits designed to perform one or more functions. The storage devices (ROM 122a, RAM 122b) comprises code such as a set of instructions, and the processor 122c is operable to execute the set of instructions to provide the functionality described herein. Alternatively or additionally, processor 122c can access code from a storage device in the memory structure, such as a reserved area of memory cells connected to one or more word lines. Memory interface 122d, in communication with ROM 122a, RAM 122b and processor 122c, is an electrical circuit that provides an electrical interface between Controller 122 and memory die 108. For example, memory interface 122d can change the format or timing of signals, provide a buffer, isolate from surges, latch I/O, etc. Processor 122C can issue commands to control circuitry 110 (or any other component of memory die 108) via Memory Interface 122d. Host Interface 122e in communication with ROM 122a, RAM 122b and processor 122c, is an electrical circuit that provides an electrical interface between Controller 122 and host 140. For example, Host Interface 122e can change the format or timing of signals, provide a buffer, isolate from surges, latch I/O, etc. Commands and data from host 140 are received by Controller 122 via Host Interface 122e. Data sent to host 140 are transmitted via Host Interface 122e.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form vertical NAND strings that traverse across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
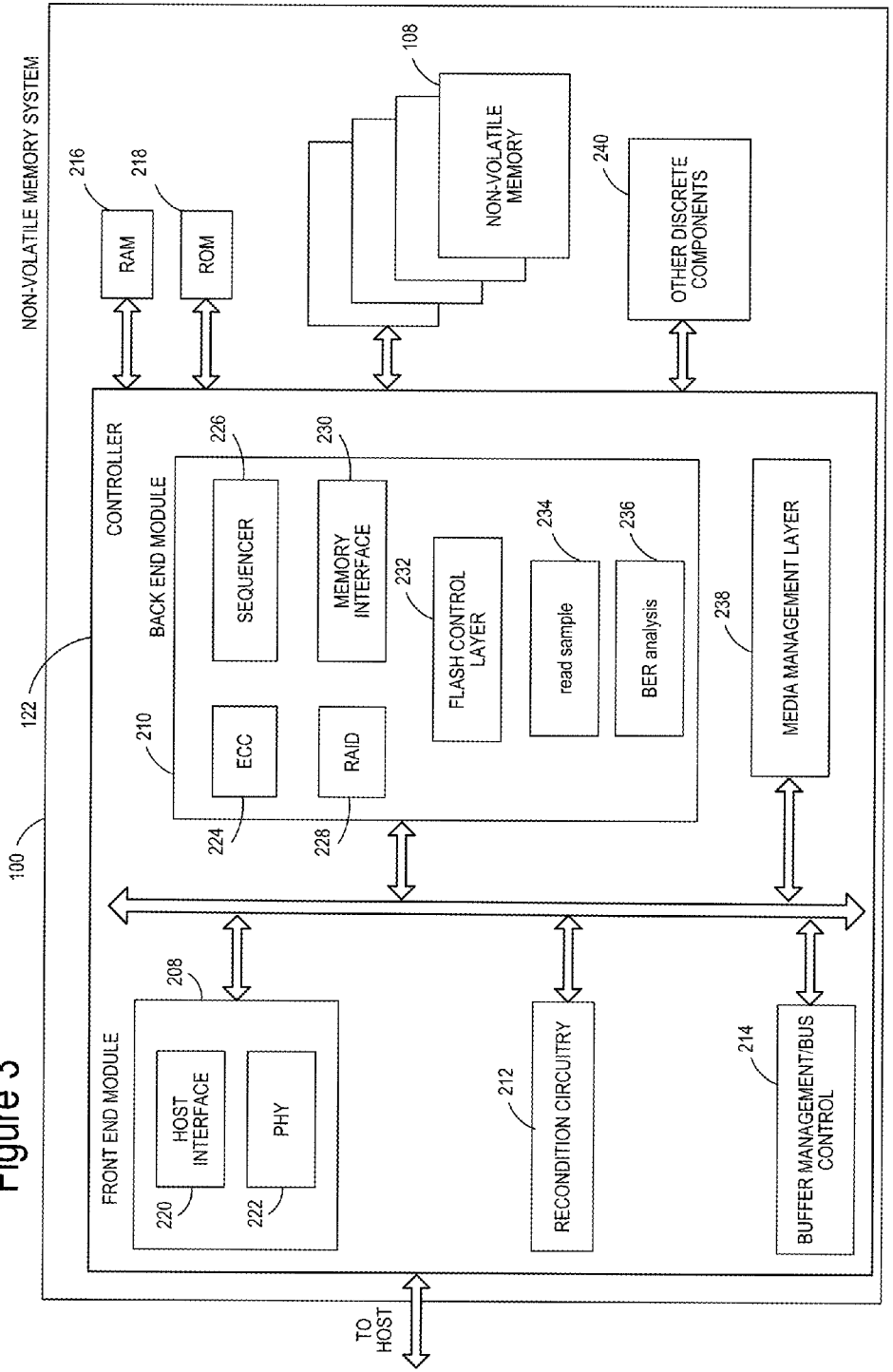
FIG. 3 is a block diagram depicting one embodiment of a Controller.

FIG. 3 is a block diagram of example memory system 100, depicting more details of Controller 122. In one embodiment, the system of FIG. 3 is a solid state drive. As used herein, a flash memory Controller is a device that manages data stored on flash memory and communicates with a host, such as a computer or electronic device. A flash memory Controller can have various functionality in addition to the specific functionality described herein. For example, the flash memory Controller can format the flash memory to ensure the memory is operating properly, map out bad flash memory cells, and allocate spare memory cells to be substituted for future failed cells. Some part of the spare cells can be used to hold firmware to operate the flash memory Controller and implement other features. In operation, when a host needs to read data from or write data to the flash memory, it will communicate with the flash memory Controller. If the host provides a logical address to which data is to be read/written, the flash memory Controller can convert the logical address received from the host to a physical address in the flash memory. (Alternatively, the host can provide the physical address). The flash memory Controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between Controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host, such as in the form of a solid state disk (SSD) drive installed in a personal computer.

In some embodiments, non-volatile memory system 100 includes a single channel between Controller 122 and non-volatile memory die 108, the subject matter described herein is not limited to having a single memory channel. For example, in some memory system architectures, 2, 4, 8 or more channels may exist between the Controller and the memory die, depending on Controller capabilities. In any of the embodiments described herein, more than a single channel may exist between the Controller and the memory die, even if a single channel is shown in the drawings.

As depicted in FIG. 3, Controller 112 includes a front end module 208 that interfaces with a host, a back end module 210 that interfaces with the one or more non-volatile memory die 108, and various other modules that perform functions which will now be described in detail.

The components of Controller 122 depicted in FIG. 3 may take the form of a packaged functional hardware unit (e.g., an electrical circuit) designed for use with other components, a portion of a program code (e.g., software or firmware) executable by a (micro)processor or processing circuitry (or one or more processors) that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include or comprise software stored in a processor readable device (e.g., memory) to program a one or more processors for Controller 122 to perform the functions described herein. The architecture depicted in FIG. 3 is one example implementation that may (or may not) use the components of Controller 122 depicted in FIG. 2 (i.e. RAM, ROM, processor, interface).

Controller 122 may include recondition circuitry 212, which is used for reconditioning memory cells or blocks of memory. The reconditioning may include refreshing data in its current location or reprogramming data into a new word line or block as part of performing erratic word line maintenance, as described below.

Referring again to modules of the Controller 122, a buffer manager/bus Controller 214 manages buffers in random access memory (RAM) 216 and controls the internal bus arbitration of Controller 122. A read only memory (ROM) 218 stores system boot code. Although illustrated in FIG. 3 as located separately from the Controller 122, in other embodiments one or both of the RAM 216 and ROM 218 may be located within the Controller. In yet other embodiments, portions of RAM and ROM may be located both within the Controller 122 and outside the Controller. Further, in some implementations, the Controller 122, RAM 216, and ROM 218 may be located on separate semiconductor die.

Front end module 208 includes a host interface 220 and a physical layer interface (PHY) 222 that provide the electrical interface with the host or next level storage Controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction Controller (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

Back end module 210 also includes a read sample module 234 and a BER analysis module 236. In one embodiment, read sample module 234 determines random samples of memory cells storing host data and system data on all memory dies to be tested in the memory system and causes performance of read processes to obtain information about bit error rate for the read processes. In one embodiment, BER analysis module 236 analyzes bit error rates to determine whether performance criteria indicates degrade in read performance and instructs the memory dies whether to enable performance improvement features. More details about the functions of read sample module 234 and a BER analysis module 236 are provided below with respect to FIGS. 6 and 7.

Additional components of system 100 illustrated in FIG. 3 include media management layer 238, which performs wear leveling of memory cells of non-volatile memory die 108. System 100 also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus Controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory 126 of die 108. The MML 238 may be needed because: 1) the flash memory may have limited endurance; 2) the flash memory 126 may only be written in multiples of pages; and/or 3) the flash memory 126 may not be written unless it is erased as a block. The MML 238 understands these potential limitations of the flash memory 126 which may not be visible to the host. Accordingly, the MML 238 attempts to translate the writes from host into writes into the flash memory 126. As described below, erratic bits may be identified and recorded using the MML 238. This recording of erratic bits can be used for evaluating the health of blocks and/or word lines (the memory cells on the word lines).

Controller 122 may interface with one or more memory dies 108. In one embodiment, Controller 122 and multiple memory dies (together comprising non-volatile storage system 100) implement a solid state drive (SSD), which can emulate, replace or be used instead of a hard disk drive inside a host, as a NAS device, etc. Additionally, the SSD need not be made to work as a hard drive.

In one embodiment, as discussed below with respect to FIGS. 7-12B, Controller 122 determines candidate bad blocks to test for usability based on previously recorded error codes, causes testing of the candidate bad blocks for usability, and causes storage of information in candidate blocks determined to be still usable.

Figure 4:
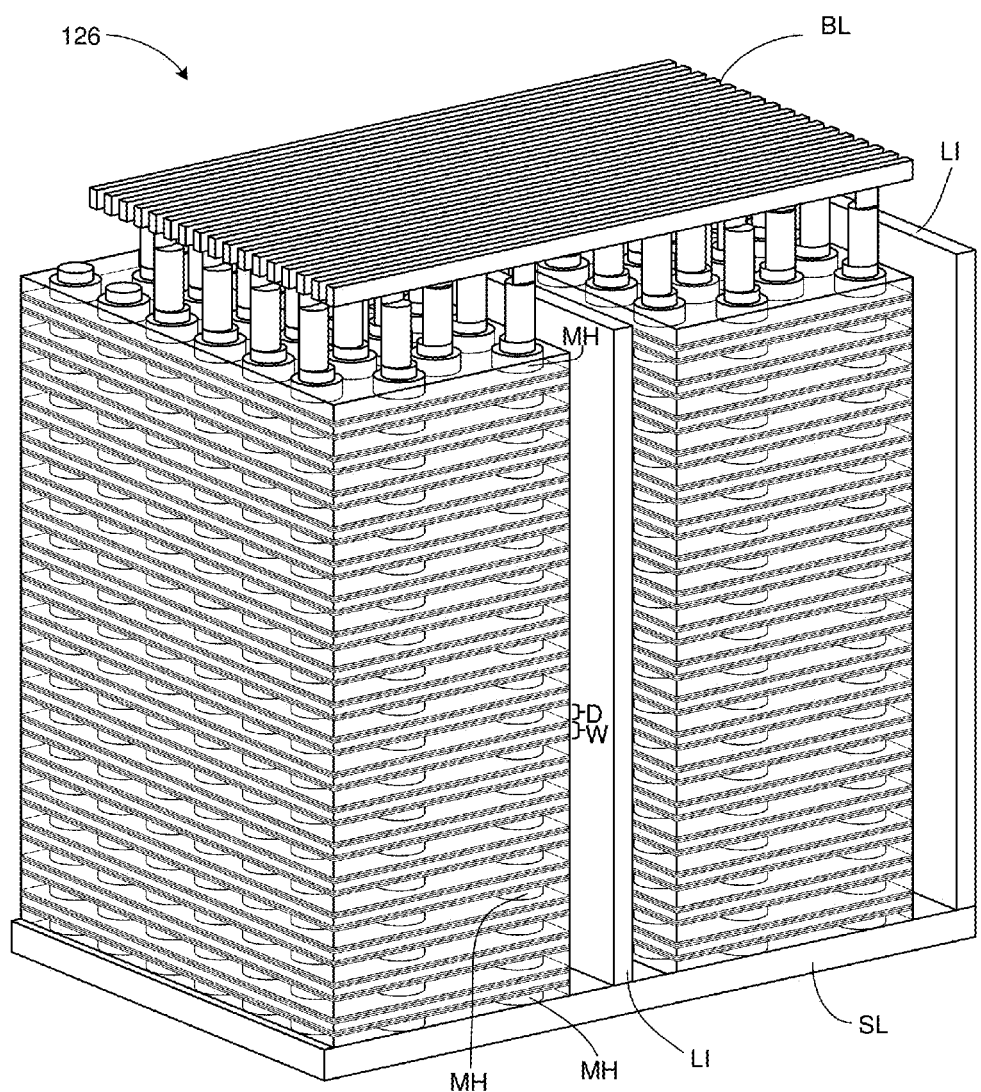
FIG. 4 is a perspective view of a portion of one embodiment of a three dimensional monolithic memory structure.

FIG. 4 is a perspective view of a portion of a monolithic three dimensional memory structure 126, which includes a plurality memory cells. For example, FIG. 4 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI. FIG. 4 only shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three dimensional monolithic memory structure 126 is provided below with respect to FIG. 4A-4F.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 302 includes block 0, 2, 4, 6, . . . and plane 304 includes blocks 1, 3, 5, 7, . . . In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits.

Figure 4B:
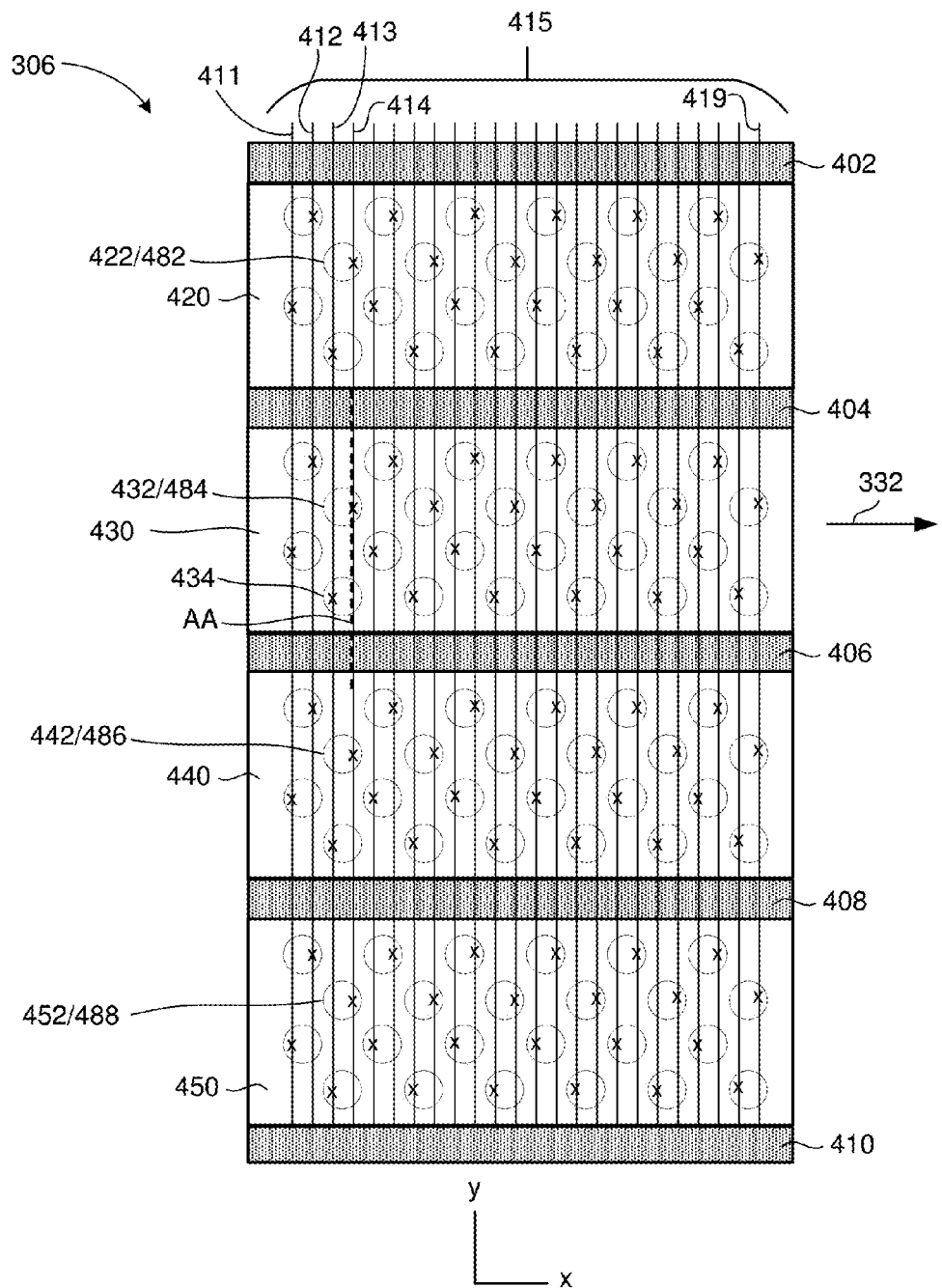
FIG. 4B depicts a top view of a portion of a block of memory cells.

FIGS. 4B-4F depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array will have 60 layers. Other embodiments have less than or more than 60 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B FIG. 4B also depicts a set of bit lines 415, including bit lines 411, 412, 413, 414, . . . , 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns.

Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side select lines and the drain side select lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
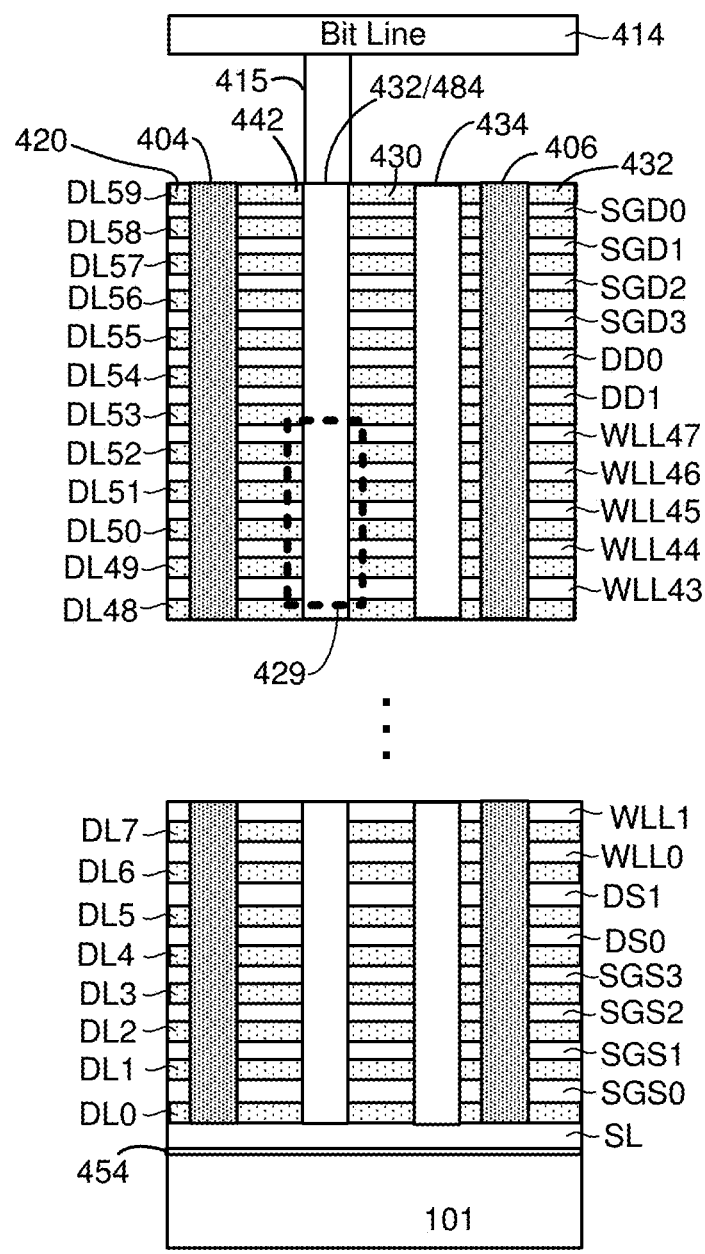
FIG. 4C depicts a cross sectional view of a portion of a block of memory cells.

FIG. 4C depicts a portion of an embodiment of three dimensional memory structure 126 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; four dummy word line layers DD0, DD1, DS0 and DS1; and forty eight data word line layers WLL0-WLL47 for connecting to data memory cells. Other embodiments can implement more or less than four drain side select layers, more or less than four source side select layers, more or less than four dummy word line layers, and more or less than forty eight word line layers (e.g., 96 word line layers). Vertical columns 432 and 434 are depicted protruding through the drain side select layers, source side select layers, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DD0, DD1, DS0 and DS1 connect to dummy memory cells. A dummy memory cell does not store user data, while a data memory cell is eligible to store user data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

Figure 4D:
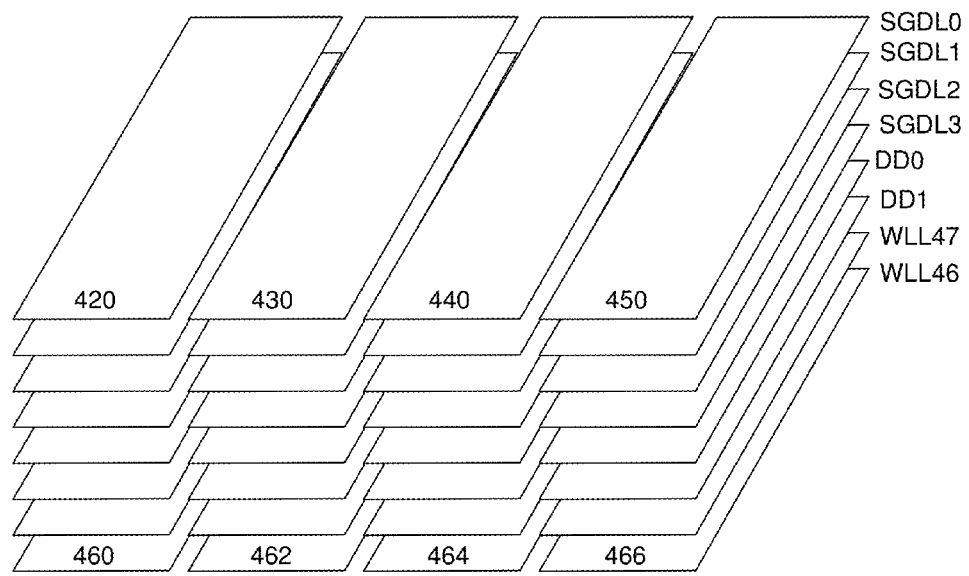
FIG. 4D depicts a view of the select gate layers and word line layers.
Figure 4D:
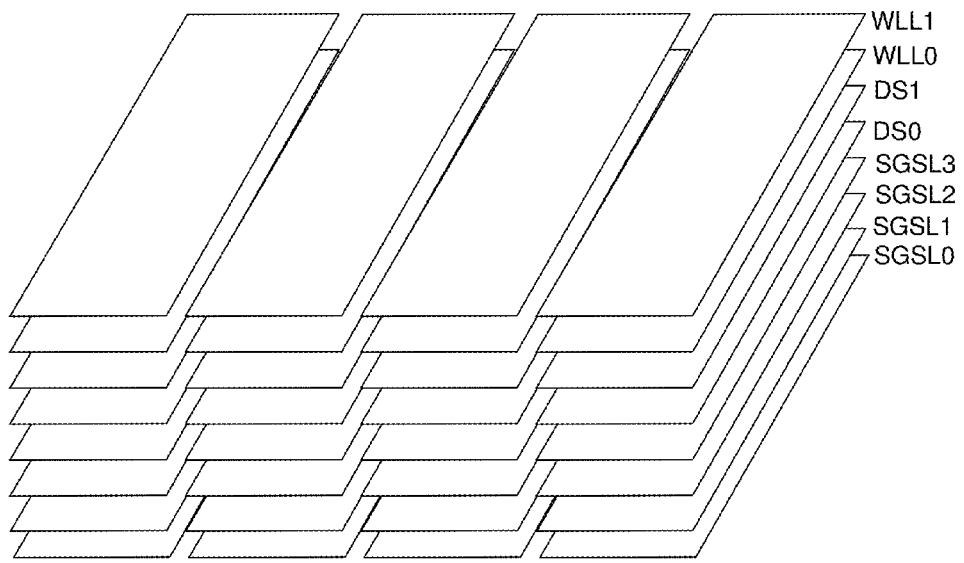

FIG. 4D depicts a logical representation of the conductive layers (SGD0, SGD1, SGD2, SGD3, SGS0, SGS1, SGS2, SGS3, DD0, DD1, DS0, DS1, and WLL0-WLL47) for the block that is partially depicted in FIG. 4C. As mentioned above with respect to FIG. 4B, in one embodiment local interconnects 402, 404, 406, 408 and 410 break up each conductive layers into four regions or fingers. For example, word line layer WLL31 is divided into regions 460, 462, 464 and 466. For word line layers (WLL0-WLL31), the regions are referred to as word line fingers; for example, word line layer WLL46 is divided into word line fingers 460, 462, 464 and 466. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

FIG. 4E depicts a cross sectional view of region 429 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
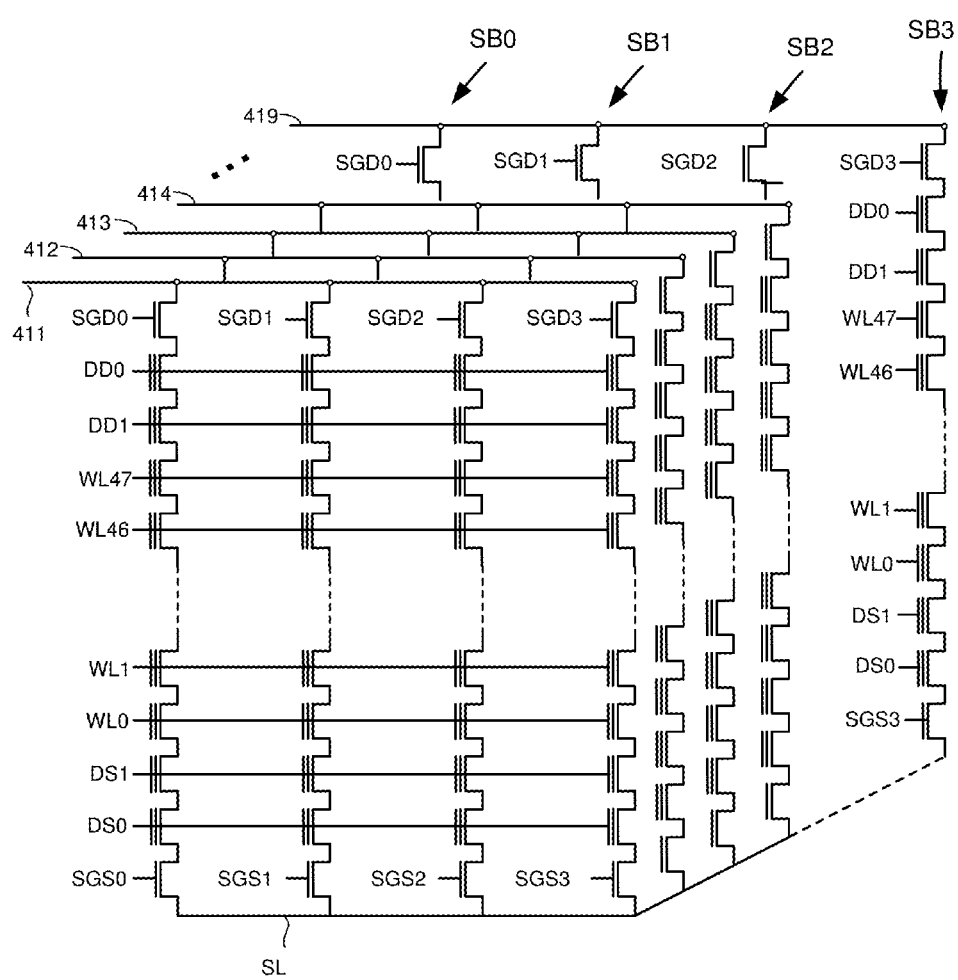
FIG. 4F is a schematic of a plurality of NAND strings.

FIG. 4F shows physical word lines WLL0-WLL47 running across the entire block. The structure of FIG. 4G corresponds to portion 306 in Block 2 of FIGS. 4A-F, including bit lines 411, 412, 413, 414, . . . 419. Within the block, each bit line connected to four NAND strings. Drain side select lines SGD0, SGD1, SGD2 and SGD3 are used to determine which of the four NAND strings connect to the associated bit line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 4-4F is a three dimensional memory structure that includes vertical NAND strings with charge-trapping material, other (2D and 3D) memory structures can also be used with the technology described herein. For example, floating gate memories (e.g., NAND-type and NOR-type flash memory ReRAM memories, magnetoresistive memory (e.g., MRAM), and phase change memory (e.g., PCRAM) can also be used.

One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe-Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory cell array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5 also shows seven read reference voltages, Vr1, Vr2, Vr3, Vr4, Vr5, Vr6, and Vr7, for reading data from memory cells. By testing whether the threshold voltage of a given memory cell is above or below the seven read reference voltages, the system can determine what data state (i.e., S0, S1, S2, S3, . . . ) the memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv4. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming (including, but not limited to, multiple stage/phase programming). In some embodiments, data states S1-D7 can overlap, with Controller 122 relying on ECC to identify the correct data being stored.

FIG. 5A is a table describing one example of an assignment of data values to data states. In the table of FIG. 5A, S0-111. S1=110, S2=200, S3=000, S4=010, S5=011, S6=001 and S7=101. Other encodings of data can also be used. No particular data encoding is required by the technology disclosed herein.

Memory systems often use Error Correction Codes (ECC) to protect data form corruption. Many ECC coding schemes are well known in the art. These conventional error correction codes are especially useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC codes are better suited for flash memory devices than others. Generally, ECC codes for flash memory devices tend to have higher code rates (i.e., a lower ratio of code bits to data bits) than the codes used in data communications applications (which may have code rates as low as ½). Examples of well-known ECC codes commonly used in connection with flash memory storage include Reed-Solomon codes, other BCH codes, Hamming codes, and the like. Sometimes, the error correction codes used in connection with flash memory storage are "systematic," in that the data portion of the eventual code word is unchanged from the actual data being encoded, with the code or parity bits appended to the data bits to form the complete code word.

The particular parameters for a given error correction code include the type of code, the size of the block of actual data from which the code word is derived, and the overall length of the code word after encoding. For example, a typical BCH code applied to a sector of 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits. In the flash memory context, error correction coding provides substantial improvement in manufacturing yield, as well as in the reliability of the flash memory over time.

In some embodiments, the Controller 122 receives host data, also referred to as information bits, that is to be stored non-volatile three dimensional memory structure 126. The informational bits are represented by the matrix i=[1 0] (note that two bits are used for example purposes only, and many embodiments have code words longer than two bits). An error correction coding process (such as any of the processes mentioned above or below) is implemented in which parity bits are added to the informational bits to provide data represented by the matrix or code word v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R. G. Gallager, "Low-density paritycheck codes," IRE Trans. Inform. Theory, vol. IT-8, pp. 21 28, Jan. 1962; and D. MacKay, Information Theory, Inference and Learning Algorithms, Cambridge University Press 2003, chapter 47. In practice, such LDPC codes are typically applied to multiple pages encoded across a number of storage elements, but they do not need to be applied across multiple pages. The data bits can be mapped to a logical page and stored in the non-volatile storage 126 by programming one or more memory cells to one or more programming states, which corresponds to v.

In one possible implementation, an iterative probabilistic decoding process is used which implements error correction decoding corresponding to the encoding implemented in the Controller 122. Further details regarding iterative probabilistic decoding can be found in the above-mentioned D. MacKay text. The iterative probabilistic decoding attempts to decode a code word read from the memory by assigning initial probability metrics to each bit in the code word. The probability metrics indicate a reliability of each bit, that is, how likely it is that the bit is not in error. In one approach, the probability metrics are logarithmic likelihood ratios LLRs which are obtained from LLR tables. LLR values are measures of the reliability with which the values of various binary bits read from the storage elements are known.

The LLR for a bit is given by $$Q = \log_2 \frac{P(v=0\mid Y)}{P(v=1\mid Y)},$$

where P(v=0|Y) is the probability that a bit is a 0 given the condition that the state read is Y, and P(v=1|Y) is the probability that a bit is a 1 given the condition that the state read is Y. Thus, an LLR>0 indicates a bit is more likely a 0 than a 1, while an LLR<0 indicates a bit is more likely a 1 than a 0, to meet one or more parity checks of the error correction code. Further, a greater magnitude indicates a greater probability or reliability. Thus, a bit with an LLR=63 is more likely to be a 0 than a bit with an LLR=5, and a bit with an LLR=−63 is more likely to be a 1 than a bit with an LLR=−5. LLR=0 indicates the bit is equally likely to be a 0 or a 1.

An LLR value can be provided for each of the bit positions in a code word. Further, the LLR tables can account for the multiple read results so that an LLR of greater magnitude is used when the bit value is consistent in the different code words.

Controller 122 receives the code word Y1 and the LLRs and iterates in successive iterations in which it determines if parity checks of the error encoding process have been satisfied. If all parity checks have been satisfied, the decoding process has converged and the code word has been successfully error corrected. If one or more parity checks have not been satisfied, the decoder will adjust the LLRs of one or more of the bits which are inconsistent with a parity check and then reapply the parity check or next check in the process to determine if it has been satisfied. For example, the magnitude and/or polarity of the LLRs can be adjusted. If the parity check in question is still not satisfied, the LLR can be adjusted again in another iteration. Adjusting the LLRs can result in flipping a bit (e.g., from 0 to 1 or from 1 to 0) in some, but not all, cases. In one embodiment, another parity check is applied to the code word, if applicable, once the parity check in question has been satisfied. In others, the process moves to the next parity check, looping back to the failed check at a later time. The process continues in an attempt to satisfy all parity checks. Thus, the decoding process of Y1 is completed to obtain the decoded information including parity bits v and the decoded information bits i.

Once data is programmed into the memory cells, the data is available to be read. In one embodiment, the memory system will read the data in response to a request from the host 140. As with most electronic devices, performance is important to users. Therefore, there is a desire to improve read performance. Some memory systems will utilize performance improvement features that will help speed up the read process. Often these performance improvement features are implemented on the memory die 108. Controller 122 has the option of turning on or off these performance improvement features.

There are many different examples of performance improvement features for read processes. No one performance improvement feature is required for the technology described herein. Rather, the technology described herein can be used with many different performance improvement features. One example of a performance improvement feature for a read process is to shorten the time for ramping up the read reference voltage. As discussed above, the system will include various read reference voltages (e.g., $Vr1$, $Vr2$, $Vr3$, $Vr4$, $Vr5$, $Vr6$, and $Vr7$). These read reference voltages are applied to the selected word line in order to read the data stored by memory cells connected to the selected word line. To increase performance, the system may choose to shorten the time to ramp up the read reference voltages. One way to shorten the time to ramp up a read reference voltage is to attempt to ramp up to a higher voltage than the target read reference voltage. This will enable the system to reach the target read reference voltage faster.

Another performance improvement feature is to perform a read process by only reading every other NAND string along a word line rather than all NAND strings along a word line. By reading only every other NAND string, the read process can be performed quicker because the system does not need to wait for various voltages to settle due to capacitive coupling.

Another performance improvement feature can include sensing for multiple data states at the same time. Typically, memory systems sense for one data state at the same time by applying one read reference voltage at a time. For an example, system that stores three bits of data, seven sensing operations may need to be performed ($Vr1$, $Vr$, 2, . . . $Vr7$) To improve performance, the system could perform half the number of reads by only applying half (or 4 out of 7) of the read reference voltages. While applying the read reference voltages, the system can perform two sensing operations, utilizing two different bit line voltages (one bit line voltage per data state), thereby, allowing for sensing for two states in response to one word line voltage. More information about sensing for two states in response to one word line voltage can be found in U.S. patent application Ser. No. 14/817,767 "Multiple Bit Line Voltage Sensing For Non-Volatile Memory," incorporated herein by reference in its entirety.

Another performance improvement feature includes shortening the sense time during the read process. The sense amplifiers inside sense blocks 150 (see FIG. 2) include various voltages used to test whether current is flowing in a NAND string. By changing these voltages to lower voltages and/or lowering the read reference voltages, shorter sense times can be accomplished. With shorter sense times, the read process will be shortened in time.

While each of these performance improvement features can reduce the time needed to perform a read process, they also run the risk of causing more errors in the data. Thus, the performance improvement features do improve performance for the read processes, but under the right conditions. Therefore it is proposed to selectively use these performance improvement features in situations when they are not degrading the read process.

In general, if the number of errors in data sensed increases due to the performance improvement features, then the ECC decoding process could take more time to complete. If the decoding process takes longer, it may negate the increase in performance from the performance improvement feature. Therefore, it is proposed that the system conduct an active read sampling to obtain statistics about the bit error rate for reading. With that information, the system will enable the performance improvement features for future read processes based on the statistics about the bit error rate. For example, FIG. 6 is a flowchart describing one embodiment of a process for performing the read sampling to obtain information about bit error rate and enabling a performance improvement feature for future processes based on the information about bit error rate. The process of FIG. 6 can be performed by the one or more control circuits mentioned above. In one embodiment, Controller 122 manages the process of FIG. 6, including causing the performance of the read processes and enabling the one or more performance improvement features. The read processes are actually performed by memory chip 108 in response to Controller 122. In other embodiments, the entire process of FIG. 6 can be performed on memory die 108.

In step 602 of FIG. 6, the system successfully performs one or more read processes to obtain information about bit error rate for the read processes. In step 604, the system enables performance improvement feature(s) for future reads based on the information about bit error rate. If the bit error rate is high, for example, it may not make sense to enable the performance improvement feature(s) because the performance improvement feature(s) may be degrading performance. As mentioned above, high bit error rate could take longer to resolve, which could cause a degradation in performance.

Figure 7:
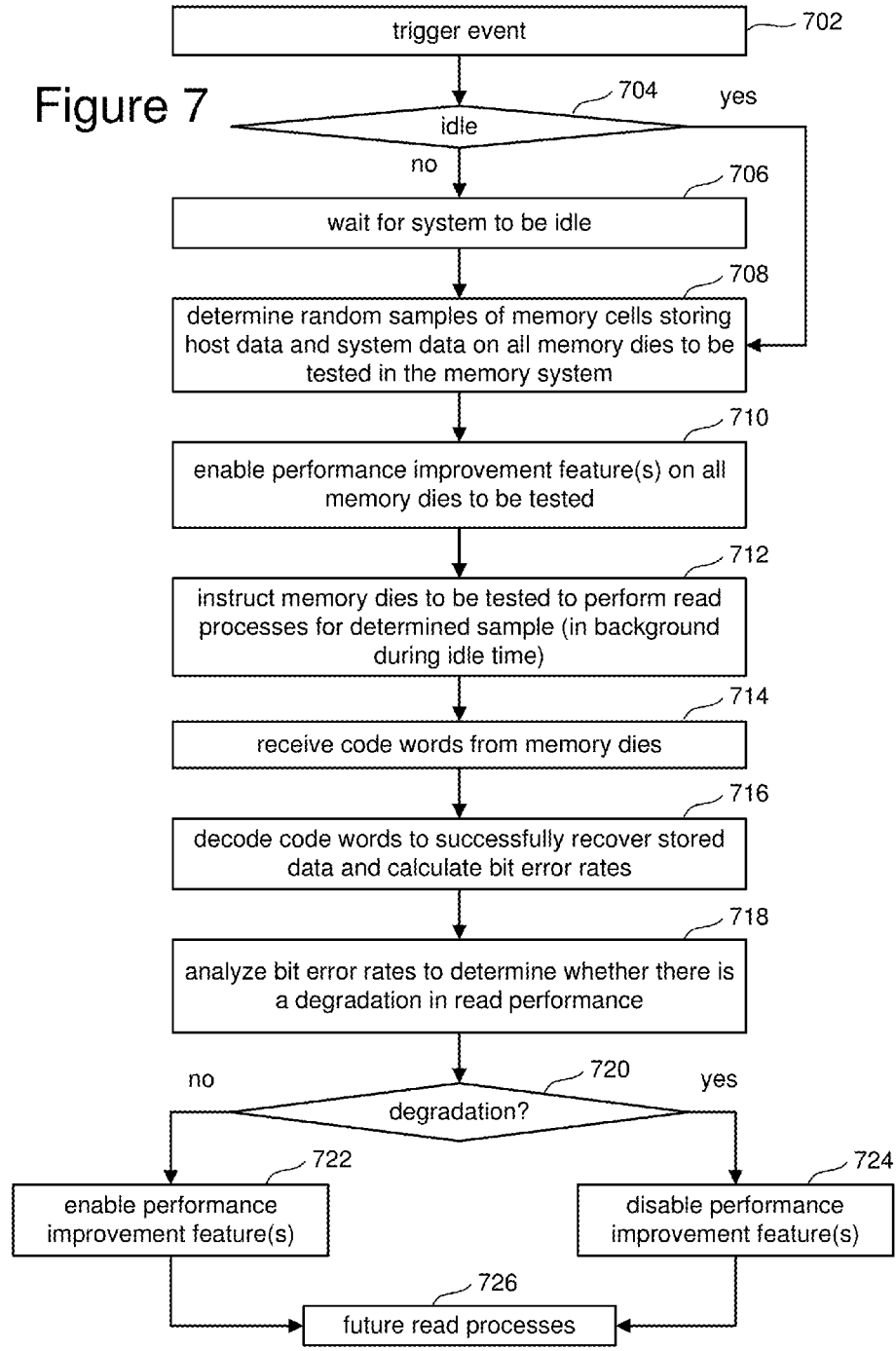
FIG. 7 is a flow chart describing one embodiment of a process for performing read sampling to obtain information about bit error rate and enabling a performance improvement feature for future read processes based on the information about bit error rate.

FIG. 7 is a flowchart describing one embodiment of a process for performing read sampling to obtain information about bit error rate and enabling performance improvement feature for future read processes based on the information about bit error rate. That is, FIG. 7 is one example implementation of the process of FIG. 6. The process of FIG. 7 can be performed by the one or more control circuits mentioned above. In one embodiment, the process of FIG. 7 is performed by and/or at the direction of controller 122, using read sample module 234 and BER analysis module 236 (see FIG. 3).

In step 702, a trigger event occurs. This trigger event is used to start the process of FIG. 7 to perform the self-test described herein. In one example, the trigger event could include power up (also called power-on) of the memory system (initialization). Alternatively, the process of FIG. 7 can be performed periodically, randomly during idle time, in response to obtaining a high bit error rate during a read process, or in response to a change in temperature. In one example, temperature detection circuit 113 (see FIG. 2) of a memory chip 108 periodically senses (monitors) current temperature. That temperature information is sent to Controller 122. If there is a change in temperature by more than a predetermined amount, then there is a trigger event to start the process of FIG. 7 (which includes the successful reading of samples discussed below).

If there is a trigger event (step 702), the process of FIG. 7 will commence. In step 704, Controller 122 determines whether the memory system is idle. If the memory system is not idle, then Controller 122 will wait (step 706) until the memory system is idle to continue with the process of FIG. 7. If the memory system is idle, then the process continues at step 708, during which Controller 122 determines a random sample of memory cells to be part of the self-test process. In one embodiment, Controller 122 only consider memory cells that are storing host data and memory cells that are storing system data for inclusion in the sample. In one example implementation, the random sample of memory cells will include memory cells from all of the memory dies 108 of the memory system. In other embodiments, the random samples can include memory cells from a subset of dies 108. In some embodiments, the self-test of FIG. 7 is only performed on a subset of dies 108 and, therefore, the sample chosen in step 708 will only include memory cells from the memory does 108 participating in the self-test. In step 710, Controller 122 enable the performance improvement feature(s) on all the memory dies being tested. In one example implementation, the process of FIG. 7 will only perform a self-test for one performance improvement feature. Therefore, that performance improvement feature will then be enabled on all the memory dies 108 that are being tested. In other embodiments, the process of FIG. 7 includes performing a self-test for multiple performance improvement features simultaneously. In that situation, Controller 122 enables all the performance improvement features on all the memory dies 108 to be tested.

In step 712, Controller 122 instructs all the memory dies 108 to be tested to perform read processes for their respective determined sample of memory cells. The memory dies 108 perform the request read processes in the background during idle time for the memory system. In this manner, performing the self-test of FIG. 7 will not interfere with operation of the memory system, at least from the perspective of the host. The result of the read processes will be a set of code words that are read from the memory cells. These code words are the raw data that are read out. A code word can represent data read out for all memory cells connected to a word line, a subset of memory cells connected to a word line or memory cells connected to multiple word lines. The data is encoded as per the ECC process. In step 714, these code words are transmitted from the memory dies 108 to Controller 122. In step 716, Controller 122 (see ECC Engine 224 of FIG. 3) decodes the code words using the ECC process. When successfully recovering the data using the ECC process, the system will often correct one or more errors. As part of the decoding process, Controller 122 calculates bit error rates for the code words. In one embodiment, the bit error rate (BER) is reported as a percentage of failed bits divided by total bits. A failed bit can be defined as a bit that was changed by the ECC process from the value sensed in the memory die. In some example implementations, if the bit error rate for a code word is 2%, then the ECC process will fail. Some ECC processes can correct data when there's a bit error rate of 1.5% or less. The larger the bit error rate, the more bits that need to be corrected and the longer it takes to decode the code words. Therefore, as successful read process includes recovering the original data (including potentially correcting some errors) and calculating a bit error rate. In one embodiment, there is one bit error rate calculated for each code word. In other embodiments, a bit error rate is calculated for multiple code words.

In step 718, Controller 122 analyze the bit error rates to determine whether there is a degradation in read performance. As mentioned above, if there is a sufficient degrade in read performance, the system may choose to not enable the performance improvement features. If there has not been a sufficient degradation in performance (step 720), then Controller 122 will enable the performance improvement feature(s) for the dies being tested in step 722. In one embodiment, enabling the performance improvement feature(s) can include setting a register in the memory dies to indicate to enable the performance improvement feature(s), sending an instruction to the memory dies to enable the performance improvement feature(s), or not turning off the performance improvement feature(s) that have already been turned on. If there has been a sufficient degradation in performance (step 720), then in step 724, Controller 122 will disable the performance improvement feature(s). For example, Controller 122 can send instruction to the memory dies to turn off the performance improvement features, Controller 122 can set a register in the memory dies to indicate that the performance improvement feature(s) should be off, or Controller 122 will not turn on a performance improvement feature that has already been turned off. In effect, steps 722 and 724 include performing future reads using a first type of read process if the error rates meet first criteria and performing future reads using a second type of read process if the error rates do not meet the first criteria, where the first type of read process includes the base reading process with one or more performance improvement feature(s) and the second type of read process includes the base reading process without one or more performance improvement feature(s) (or with a subset).

After step 722 and step 724, the memory system (including Controller 122 and memory dies 108) will perform future read processes in step 726. If the performance improvement feature(s) have been enabled, the future read processes are performed with the performance improvement feature(s). If the performance improvement feature(s) have been disabled (or not enabled), then the future read processes will be performed without the performance improvement features.

Note that in one embodiment, the performance improvement feature(s) that are enabled/disabled are the same performance improvement feature(s) that are implemented when running the read processes on the samples of memory cells.

The process of FIG. 7 can be performed for multiple dies. Alternatively, the process of FIG. 7 can be performed separately and independently for each of all or a subset of dies. Regardless of whether the process of FIG. 7 is performed concurrently for multiple dies or separately for the various dies, Controller 122 can enable/disable performance improvement feature(s) separately and independently for each die based on bit error rates for the respective die or Controller 122 can enable/disable performance improvement feature(s) as a single act/decision for multiple dies.

The self-test process of FIG. 7 is designed to be performed quickly so that it will not impact the host. In one example embodiment, the sample of memory cells tested will be 25 MB spread out over the entire memory system. If the memory system includes 256 GB, then the sample will be approximately 0.009% of the drive, and the process of FIG. 7 can be performed within approximately 50 milliseconds during idle time in the background. The sample size of 25 MB is only one example, and other sample sizes can also be used.

Step 718 includes analyzing the bit error rates to determine whether there has been a degradation in performance sufficient to disable the performance improvement features. There are various options for doing such analysis. In one embodiment, Controller 122 computes an average bit error rate. For example, each of the code words will include a bit error rate and Controller 122 will determine the average bit error rate for all the code words. If the bit error rate is for units other than code words, the bit error rates can still be used to compute an average bit error rate. Controller 122 will then determine if the average bit error rate exceeds a certain threshold (e.g., 1.5%, 1% or other values). If the average bit error rate exceeds the threshold, then Controller 122 will disable (or not enable) the performance improvement feature(s). If the average bit error rate is below or equal to the threshold, then Controller 122 will enable the performance improvement feature(s).

In another embodiment, controller 122 will determine the number or percentage of bit error rates that are above a threshold (e.g., 1.5%, 1% or other values). If the number of bit error rates or the percentage of bit error rates that exceed a threshold are greater than a predetermined percentage, then Controller 122 will disable the performance improvement features.

In another embodiment, Controller 122 will classify the bit error rates into various ranges. For example a first (low) range may be bit error rates below or equal to 0.5%, a second (medium) range could be bit error rates above 0.5% and less than or equal to 1.0%, and a third (high) range could be bit error rates above 1.0% and less than or equal to 1.5%. Other ranges and range boundaries can also be used. Controller 122 will disable the performance improvement feature(s) for future reads if a percentage of bit error rates in at least two of the ranges satisfy first criteria and enable the performance improvement feature(s) if the bit error rates in at least two ranges do not satisfy the first criteria. For example, if at least x % of all bit error rates are in the medium range and at least y % of all bit error rates are in the high range, then Controller 122 will disable (or not enable) the performance improvement feature(s); otherwise, Controller 122 will enable the performance improvement feature(s).

FIG. 8 is a flow chart describing a method of reading data on a memory die. The steps of FIG. 8 are performed by the circuits on the memory die (see FIG. 2) at the direction of state machine 112. Each memory die 108 can/will perform the read process of FIG. 8 separately, independently and concurrently. The process of FIG. 8 is performed in response to instructions from Controller 122; for example, the process of FIG. 8 can be initiated by a memory die 108 in response to step 712 of FIG. 7. The memory dies 108 performing the process of FIG. 8 will provide the code words to the Controller 122 as part of step 714 of FIG. 7.

In step 802, the memory die 108 receives one or more instructions from Controller 122 to perform a read process. The read process can be for all memory cells connected to a word line, all memory cells in a sub block that are connected to a word line, or other grouping of memory cells. Additionally, the read process can be for memory cells connected to multiple word lines.

In step 804, the memory die performs a read operation. The read compare voltage Vr1 (see FIG. 5) is applied to selected word line (Wln). Sense amplifiers (within the Sense Blocks 150) determine whether the selected memory cells turned on in response to the voltage Vr1 by sensing whether current flowed through the NAND strings and bit lines. If the Vr1 is greater than the threshold voltage of the selected memory cell, then that memory cell will run on and current will flow. The result of the sensing (whether current flowed or not) is stored.

In step 806, the memory die performs another read operation. The read compare voltage Vr2 (see FIG. 5) is applied to selected word line (Wln). Sense amplifiers (within the Sense Blocks 150) determine whether the selected memory cells turned on in response to the voltage Vr2 by sensing whether current flowed through the NAND strings and bit lines. The result of the sensing (whether current flowed or not) is stored.

In step 808, the memory die performs another read operation. The read compare voltage Vr3 (see FIG. 5) is applied to selected word line (Wln). Sense amplifiers (within the Sense Blocks 150) determine whether the selected memory cells turned on in response to the voltage Vr3 by sensing whether current flowed through the NAND strings and bit lines. The result of the sensing (whether current flowed or not) is stored.

In step 810, the memory die performs another read operation. The read compare voltage Vr4 (see FIG. 5) is applied to selected word line (Wln). Sense amplifiers (within the Sense Blocks 150) determine whether the selected memory cells turned on in response to the voltage Vr4 by sensing whether current flowed through the NAND strings and bit lines. The result of the sensing (whether current flowed or not) is stored.

In step 812, the memory die performs another read operation. The read compare voltage Vr5 (see FIG. 5) is applied to selected word line (Wln). Sense amplifiers (within the Sense Blocks 150) determine whether the selected memory cells turned on in response to the voltage Vr5 by sensing whether current flowed through the NAND strings and bit lines. The result of the sensing (whether current flowed or not) is stored.

In step 814, the memory die performs another read operation. The read compare voltage Vr6 (see FIG. 5) is applied to selected word line (Wln). Sense amplifiers (within the Sense Blocks 150) determine whether the selected memory cells turned on in response to the voltage Vr6 by sensing whether current flowed through the NAND strings and bit lines. The result of the sensing (whether current flowed or not) is stored.

In step 816, the memory die performs another read operation. The read compare voltage Vr7 (see FIG. 5) is applied to selected word line (Wln). Sense amplifiers (within the Sense Blocks 150) determine whether the selected memory cells turned on in response to the voltage Vr7 by sensing whether current flowed through the NAND strings and bit lines. The result of the sensing (whether current flowed or not) is stored.

In step 818, the memory die determines what data state (see FIG. 5) the memory cells are in based on the results of steps 804-816. Once knowing the data state that a memory cell is in, the memory die can assign data values for the memory cell (see FIG. 5A). In step 820, the data is transmitted from the memory die to the Controller. In one embodiment, all of the data for a word line is aggregated together to form a code word. In some embodiments, a code word represents all of the data for all memory cells connected to a word line and in one sub block. In other embodiments, the code word can represent other groupings of data.

One embodiment includes a non-volatile storage apparatus, comprising: a plurality of non-volatile memory cells and one or more control circuits in communication with the memory cells. The one or more control circuits are configured to cause performance of read processes to obtain information about bit error rate for the read processes. The one or more control circuits are configured to enable a performance improvement feature for future reads based on the information about bit error rate. The information about bit error rate can include the bit error rates, data that is representative the bit error rates, and/or data that can be used to derive the bit error rates.

One embodiment includes a method of operating non-volatile storage, comprising: successfully reading samples of data stored in non-volatile memory cells; determining error rates for the data based on the reading; performing future reads using a first type of read process if the error rates meet first criteria; and performing future reads using a second type of read process if the error rates do not meet the first criteria.

One embodiment includes an apparatus, comprising: a first communication interface configured to communicate with a host; a second communication interface configured to communicate with one or more memory dies; and one or more processors connected with the first communication interface and the second communication interface. The one or more processors are configured to instruct one or more of the memory dies to perform read processes during idle time and receive encoded information resulting from the read process. The one or more processors are configured to decode the information and determine one or more bit error rates for the information. The one or more processors are configured to instruct one or more of the memory dies on which type of read process to use for future reads of host data based on the one or more bit error rates.

One embodiment includes an apparatus, comprising: means for causing performance of read sampling to obtain information about bit error rate; and means for enabling a performance improvement feature for future read processes based on the information about bit error rate.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
   a plurality of non-volatile memory cells; and
   one or more control circuits in communication with the memory cells, the one or more control circuits are configured to cause performance of a read process and receive encoded information resulting from the read processes, the one or more control circuits are configured to decode the encoded information and determine information about bit error rates for the encoded information, the one or more control circuits are configured to enable a performance improvement feature for future reads based on the information about bit error rate.

2. A non-volatile storage apparatus according to claim 1, wherein:
   the one or more control circuits are configured to randomly choose samples of memory cells for the read process.

3. A non-volatile storage apparatus according to claim 1, wherein:
   the memory cells are on multiple dies that are in communication with the one or more control circuits; and
   the one or more control circuits are configured to choose samples of memory cells from each of the dies for the read process.

4. A non-volatile storage apparatus according to claim 1, wherein:
   the memory cells are on multiple dies that are in communication with the one or more control circuits; and
   the one or more control circuits are configured to enable the performance improvement feature separately and independently for each die based on bit error rates for the respective die.

5. A non-volatile storage apparatus according to claim 1, wherein:

the one or more control circuits are configured to choose samples of memory cells for the read process that include host data and system data.

6. A non-volatile storage apparatus according to claim 1, wherein:
the one or more control circuits are configured to cause performance of the read process during idle time in for the non-volatile storage apparatus.

7. A non-volatile storage apparatus according to claim 1, wherein:
the one or more control circuits are configured to cause the performance of the read process and to enable the performance improvement feature for future reads upon a power-on event.

8. A non-volatile storage apparatus according to claim 1, wherein:
the one or more control circuits are configured to monitor temperature; and
the one or more control circuits are configured to cause the performance of the read process and to enable the performance improvement feature for future reads upon a change in temperature.

9. A non-volatile storage apparatus according to claim 1, wherein:
the one or more control circuits are configured to cause the performance of read process while multiple performance improvement features are enabled, the one or more control circuits are configured to enable the multiple performance improvement features for future reads based on the information about bit error rate.

10. A non-volatile storage apparatus according to claim 1, wherein:
the one or more control circuits decode the encoded information by decoding code words and calculating bit error rates;
the one or more control circuits are configured to computer average bit error rate;
the one or more control circuits are configured to compare average bit error rate to a threshold;
the one or more control circuits are configured to enable the performance improvement feature for future reads if the average bit error rate is below the threshold; and
the one or more control circuits are configured to disable the performance improvement feature for future reads if the average bit error rate is above the threshold.

11. A non-volatile storage apparatus according to claim 1, wherein:
the one or more control circuits are configured to compare bit error rates to a threshold;
the one or more control circuits are configured to enable the performance improvement feature for future reads if a predetermined percentage of bit error rate is below the threshold; and
the one or more control circuits are configured to disable the performance improvement feature for future reads if the predetermined percentage of bit error rate is above the threshold.

12. A non-volatile storage apparatus according to claim 1, wherein:
the one or more control circuits are configured to compare bit error rates to multiple thresholds to classify the bit error rates into ranges;
the one or more control circuits are configured to disable the performance improvement feature for future reads if a percentage of bit error rates in at least two of the ranges satisfies first criteria; and
the one or more control circuits are configured to enable the performance improvement feature for future reads if the bit error rates in at least two of the ranges do not satisfy the first criteria.

13. A non-volatile storage apparatus according to claim 1, wherein:
the plurality of non-volatile memory cells form a three dimensional memory structure.

14. A method of operating non-volatile storage, comprising:
successfully reading samples of data stored in non-volatile memory cells;
determining error rates for the data based on the reading;
performing future reads using a first type of read process if the error rates meet first criteria; and
performing future reads using a second type of read process if the error rates do not meet the first criteria.

15. A method according to claim 14, further comprising:
randomly choosing samples of memory cells for the reading that include host data and system data.

16. A method according to claim 14, wherein:
the successfully reading samples of data is performed during idle time of the memory system that comprises the non-volatile memory cells.

17. A method according to claim 14, further comprising:
monitoring for a change in temperature; and
the successfully reading samples of data is performed in response to the change in temperature.

18. An apparatus, comprising:
a first communication interface configured to communicate with a host;
a second communication interface configured to communicate with one or more memory dies; and
one or more processors connected with the first communication interface and the second communication interface, the one or more processors are configured to instruct one or more of the memory dies to perform read processes during idle time and receive encoded information resulting from the read process, the one or more processors are configured to decode the information and determine one or more bit error rates for the information, the one or more processors are configured to instruct one or more of the memory dies on which type of read process to use for future reads of host data based on the one or more bit error rates.

19. An apparatus according to claim 18, wherein:
the one or more processors configured to decode the information as part of an error correction process;
the one or more processors are configured to instruct the one or more of the memory dies to perform read processes during idle time for randomly chosen samples of memory cells storing host data and system data.

20. An apparatus A memory system, comprising:
means for determining whether the memory system is idle;
means for causing performance of read sampling to obtain information about bit error rate in response to determining that the memory system is idle; and
means for enabling a performance improvement feature for future read processes based on the information about bit error rate.

* * * * *

UNITED STATES PATENT AND TRADEMARK OFFICE
CERTIFICATE OF CORRECTION

PATENT NO. : 9,679,661 B1
APPLICATION NO. : 15/195492
DATED : June 13, 2017
INVENTOR(S) : Guo et al.

It is certified that error appears in the above-identified patent and that said Letters Patent is hereby corrected as shown below:

In the Claims

Column 24, Line 55 (Claim 20, Line 1), please change "An apparatus A memory system," to -- A memory system, --.

Signed and Sealed this
Nineteenth Day of June, 2018

Andrei Iancu
*Director of the United States Patent and Trademark Office*